United States Patent
Zhang et al.

(10) Patent No.: US 11,605,648 B2
(45) Date of Patent: Mar. 14, 2023

(54) SEMICONDUCTOR STRUCTURE AND MANUFACTURING METHOD THEREOF

(71) Applicant: United Microelectronics Corp., Hsinchu (TW)

(72) Inventors: Sheng Zhang, Singapore (SG); Chunyuan Qi, Singapore (SG); Xingxing Chen, Singapore (SG); Chien-Kee Pang, Singapore (SG)

(73) Assignee: UNITED MICROELECTRONICS CORP., Hsinchu (CN)

( * ) Notice: Subject to any disclaimer, the term of this patent is extended or adjusted under 35 U.S.C. 154(b) by 0 days.

(21) Appl. No.: 17/383,283

(22) Filed: Jul. 22, 2021

(65) Prior Publication Data
US 2022/0415926 A1    Dec. 29, 2022

(30) Foreign Application Priority Data
Jun. 29, 2021   (CN) .......................... 202110725291.0

(51) Int. Cl.
| | | |
|---|---|---|
| *H01L 27/12* | (2006.01) | |
| *H01L 21/84* | (2006.01) | |
| *H01L 21/762* | (2006.01) | |
| *H01L 21/02* | (2006.01) | |

(52) U.S. Cl.
CPC .... *H01L 27/1203* (2013.01); *H01L 21/76256* (2013.01); *H01L 21/84* (2013.01); *H01L 21/02274* (2013.01)

(58) Field of Classification Search
CPC .......... H01L 27/1203; H01L 21/76256; H01L 21/854; H01L 21/76254; H01L 21/02274
USPC .......................................... 257/506; 438/207
See application file for complete search history.

(56) References Cited

U.S. PATENT DOCUMENTS

| | | |
|---|---|---|
| 7,855,101 B2 | 12/2010 | Furman et al. |
| 8,835,281 B2 | 9/2014 | Brindle et al. |
| 9,269,591 B2 | 2/2016 | Kalnitsky et al. |
| 2019/0067085 A1* | 2/2019 | Kweskin ........... H01L 21/76254 |

* cited by examiner

*Primary Examiner* — Thinh T Nguyen
(74) *Attorney, Agent, or Firm* — J.C. Patents

(57) ABSTRACT

Provided are a semiconductor structure and a manufacturing method thereof. The semiconductor structure includes a carrier substrate, a trap-rich layer, a dielectric layer, an interconnect structure, a device structure layer and a circuit structure. The trap-rich layer is disposed on the carrier substrate. The dielectric layer is disposed on the trap-rich layer. The interconnect structure is disposed on the dielectric layer. The device structure layer is disposed on the interconnect structure and electrically connected to the interconnect structure. The circuit structure is disposed on the device structure layer and electrically connected to the device structure layer.

9 Claims, 3 Drawing Sheets

SEMICONDUCTOR STRUCTURE AND MANUFACTURING METHOD THEREOF

CROSS-REFERENCE TO RELATED APPLICATION

This application claims the priority benefit of China application serial no. 202110725291.0, filed on Jun. 29, 2021. The entirety of the above-mentioned patent application is hereby incorporated by reference herein and made a part of this specification.

BACKGROUND

Technical Field

The present invention relates to a semiconductor structure and a manufacturing method thereof, and particularly to a semiconductor structure that may improve the parasitic surface conducting effect of a silicon-on-insulator (SOI) substrate and a manufacturing method thereof.

Description of Related Art

Generally speaking, an SOI substrate is composed of a silicon base and a dielectric layer and a silicon layer that are sequentially disposed on the silicon base. For electronic device, such as a metal oxide semiconductor (MOS) transistor, that is disposed on the SOI substrate, when the electronic device is operated, too many carriers tend to accumulate at the interface between the silicon base and the dielectric layer. For example, positively charged carriers usually exist in the region of the dielectric layer close to the silicon base. As a result, during the operation of the electronic device, the positively charged carriers may attract the negatively charged carriers in the silicon base to the interface between the silicon base and the dielectric layer, causing the so-called parasitic surface conducting effect. The parasitic surface conducting effect may generate an accumulation conductive layer at the interface between the silicon base and the dielectric layer, causing the electrical signal loss of the electronic device, such as total harmonic distortion (THD).

SUMMARY

The present invention provides a semiconductor structure including a trap-rich layer disposed on a substrate.

The present invention provides a manufacturing method of a semiconductor structure, wherein two substrates are bonded, and a trap-rich layer is formed on one of the two substrates.

A semiconductor structure of the present invention includes a carrier substrate, a trap-rich layer, a dielectric layer, an interconnect structure, a device structure layer and a circuit structure. The trap-rich layer is disposed on the carrier substrate. The dielectric layer is disposed on the trap-rich layer. The interconnect structure is disposed on the dielectric layer. The device structure layer is disposed on the interconnect structure and electrically connected to the interconnect structure. The circuit structure is disposed on the device structure layer and electrically connected to the device structure layer.

In an embodiment of the semiconductor structure of the present invention, the trap-rich layer includes a polysilicon layer, an amorphous silicon layer, a silicon nitride layer, a silicon carbon nitride (SiCN) layer or a combination thereof.

In an embodiment of the semiconductor structure of the present invention, a thickness of the trap-rich layer is between 3000 Å and 20000 Å.

In an embodiment of the semiconductor structure of the present invention, the dielectric layer includes an oxide silicon layer.

In an embodiment of the semiconductor structure of the present invention, a thickness of the dielectric layer is between 2000 Å and 8000 Å.

In an embodiment of the semiconductor structure of the present invention, the carrier substrate includes a silicon substrate.

A manufacturing method of a semiconductor structure of the present invention includes the following steps. A trap-rich layer is formed on a carrier substrate. A first dielectric layer is formed on the trap-rich layer. The first dielectric layer is planarized. A device structure layer is formed on an SOI substrate, wherein the SOI substrate includes a silicon base and an insulating layer and a silicon layer sequentially stacked on the silicon base. An interconnect structure is formed on the device structure layer, wherein the interconnect structure is electrically connected to the device structure layer. A second dielectric layer is formed on the interconnect structure. The carrier substrate and the SOI substrate are bonded in a manner that the first dielectric layer faces the second dielectric layer. The silicon base of the SOI substrate is removed. A circuit structure is formed on the insulating layer, wherein the circuit structure is electrically connected to the device structure layer.

In an embodiment of the manufacturing method of the semiconductor structure of the present invention, the trap-rich layer includes a polysilicon layer, an amorphous silicon layer, a silicon nitride layer, a silicon carbon nitride layer or a combination thereof.

In an embodiment of the manufacturing method of the semiconductor structure of the present invention, a thickness of the trap-rich layer is between 3000 Å and 20000 Å.

In an embodiment of the manufacturing method of the semiconductor structure of the present invention, a thickness of the planarized first dielectric layer is between 500 Å and 5000 Å.

In an embodiment of the manufacturing method of the semiconductor structure of the present invention, the first dielectric layer includes a silicon oxide layer.

In an embodiment of the manufacturing method of the semiconductor structure of the present invention, the second dielectric layer includes a silicon oxide layer.

In an embodiment of the manufacturing method of the semiconductor structure of the present invention, the carrier substrate includes a silicon substrate.

In an embodiment of the manufacturing method of the semiconductor structure of the present invention, the method for planarizing the first dielectric layer includes performing a chemical mechanical polishing (CMP) process.

In an embodiment of the manufacturing method of the semiconductor structure of the present invention, the method for removing the silicon base of the SOI substrate includes the following steps. The silicon base is thinned. An etching process is performed on the thinned silicon base.

Based on the above, in the semiconductor structure of the present invention, the trap-rich layer is disposed between the carrier substrate and the dielectric layer. Therefore, when the semiconductor structure is operated, the trap-rich layer may be used to trap the negatively charged carriers from the carrier substrate, and reduce the mobility of the negatively charged carriers, so as to avoid the accumulation of the negatively charged carriers and the positively charged carriers in the dielectric layer to produce a cumulative conductive layer, which may effectively avoid the electrical signal loss.

In addition, when manufacturing the semiconductor structure of the present invention, after the trap-rich layer and the first dielectric layer are sequentially formed on the carrier substrate, the first dielectric layer is planarized. Therefore, the first dielectric layer may have a lower surface roughness to facilitate the subsequent bonding process.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
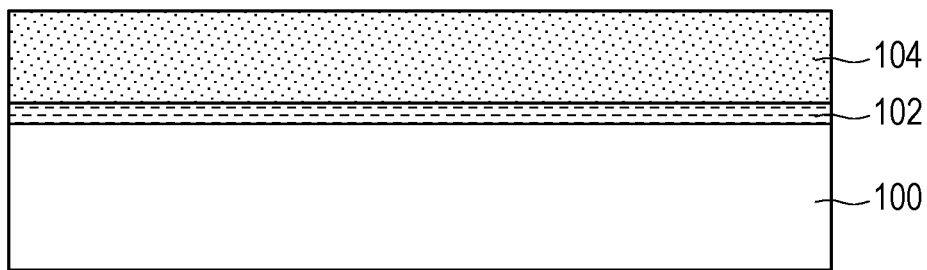
FIGS. 1A to 1F are schematic cross-sectional views of a manufacturing process of a semiconductor structure according to an embodiment of present invention.

The embodiments are described in detail below with reference to the accompanying drawings, but the embodiments are not intended to limit the scope of the present invention. In addition, the drawings are for illustrative purposes only and are not drawn to the original dimensions. For the sake of easy understanding, the same elements in the following description will be denoted by the same reference numerals.

In the text, the terms mentioned in the text, such as "comprising", "including", "containing" and "having" are all open-ended terms, i.e., meaning "including but not limited to".

In addition, the directional terms, such as "on", "above", "under" and "below" mentioned in the text are only used to refer to the direction of the drawings, and are not used to limit the present invention.

When using terms such as "first" and "second" to describe elements, it is only used to distinguish the elements from each other, and does not limit the order or importance of the devices. Therefore, in some cases, the first element may also be called the second element, the second element may also be called the first element, and this is not beyond the scope of the present invention.

In the text, a range represented by "a value to another value" is a summary expression way to avoid listing all the values in the range one by one in the specification. Therefore, the record of a specific numerical range covers any numerical value within the numerical range, as well as a smaller numerical range defined by any numerical value within the numerical range.

FIGS. 1A to 1F are schematic cross-sectional views of a manufacturing process of a semiconductor structure according to an embodiment of present invention.

Referring to FIG. 1A, a carrier substrate 100 is provided. In the present embodiment, the carrier substrate 100 is, for example, a silicon substrate. In an embodiment, the carrier substrate 100 may be a silicon wafer. Then, a trap-rich layer 102 is formed on the carrier substrate 100. In the present embodiment, the trap-rich layer 102 is, for example, a polysilicon layer, an amorphous silicon layer, a silicon nitride layer, a silicon carbon nitride layer or a combination thereof. The thickness of the trap-rich layer 102 is, for example, between 3000 Å and 20000 Å. In the present embodiment, the method for forming the trap-rich layer 102 is, for example, a chemical vapor deposition (CVD) process, but the invention is not limited thereto. During the operation of the semiconductor device, the trap-rich layer 102 may trap carriers and reduce the mobility of the carriers. Next, a first dielectric layer 104 is formed on the trap-rich layer 102. In the present embodiment, the first dielectric layer 104 is, for example, a silicon oxide layer. The thickness of the first dielectric layer 104 is, for example, between 1000 Å and 10000 Å. In the present embodiment, the method for forming the first dielectric layer 104 is, for example, a chemical vapor deposition process, but the invention is not limited thereto.

Figure 1B:
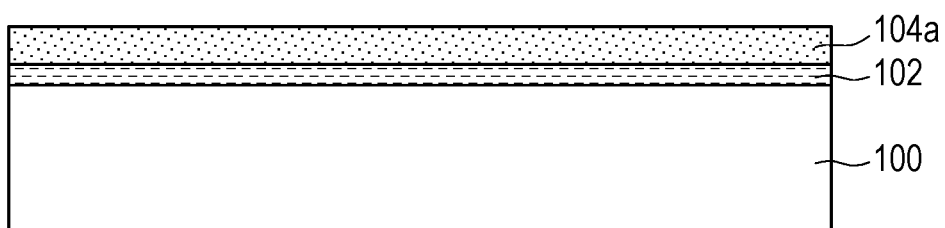

Referring to FIG. 1B, the first dielectric layer 104 is planarized, and the thickness of the first dielectric layer 104 is reduced at the same time, to form a first dielectric layer 104a. The method for planarizing the first dielectric layer 104 is, for example, a chemical mechanical process, but the present invention is not limited thereto. The thickness of the first dielectric layer 104a is, for example, between 500 Å and 5000 Å. After being planarized, the first dielectric layer 104 may have a lower surface roughness, so as to facilitate the subsequent bonding process. In particular, when the trap-rich layer 102 is a polysilicon layer, due to the material properties of the polysilicon layer itself, the film on the trap-rich layer 102 has a higher surface roughness. Therefore, after the planarization process is performed, the surface roughness of the first dielectric layer 104a may be effectively reduced to facilitate the subsequent bonding process.

Figure 1C:
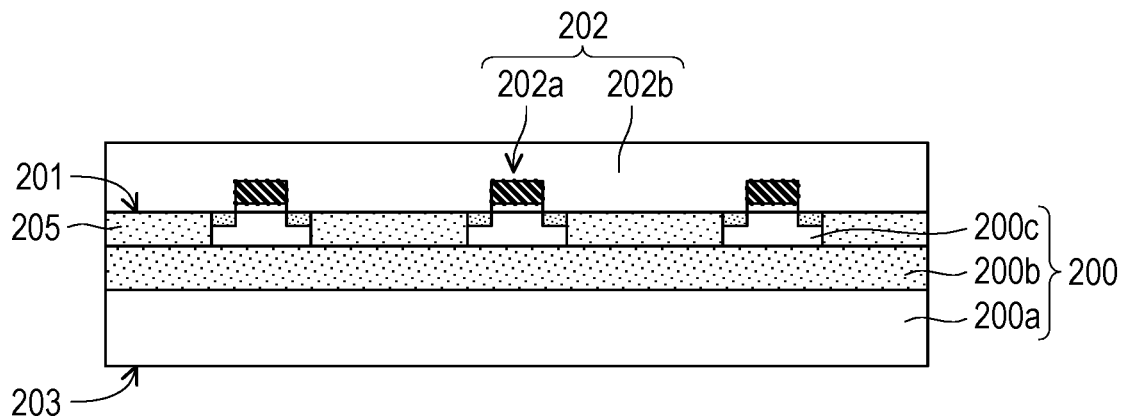

Referring to FIG. 1C, an SOI substrate 200 is provided. The SOI substrate 200 includes a silicon base 200a and an insulating layer 200b and a silicon layer 200c sequentially stacked on the silicon base 200a. Generally speaking, the silicon base 200a may be doped with P-type dopant and preferably has a thickness of about 5000 Å, the insulating layer 200b preferably has a thickness more than about 2 μm, and the silicon layer 200c may be doped with P-type dopant, for example, and preferably has a thickness greater than about 0.5 μm, but the present invention is not limited thereto. In the present embodiment, the insulating layer 200b is, for example, an oxide silicon layer. In the present embodiment, the SOI substrate 200 has a first surface 201 and a second surface 203 opposite to each other. At this stage, the first surface 201 is the front surface (also called the active surface) on which the semiconductor devices are formed, that is, the exposed top surface of the silicon layer 200c, and the second surface 203 is the back surface, that is, the exposed bottom surface of the silicon base 200a.

Then, isolation structures 205 are formed in the silicon layer 200c to define active areas (AA). The isolation structures 205 are, for example, shallow trench isolation (STI) structures. In the present embodiment, the thickness of the isolation structures 205 is the same as the thickness of the silicon layer 200c, that is, the isolation structures 205 penetrate the silicon layer 200c, so that adjacent active areas may be effectively isolated. The forming method of the isolation structures 205 is well known to those skilled in the art, and will not be further explained here. Next, a device structure layer 202 is formed on the first surface 201 of the SOI substrate 200. The device structure layer 202 includes various semiconductor devices well known to those skilled in the art, which is not limited in the present invention. For example, in the present embodiment, the device structure layer 202 includes transistors 202a formed on the active surface (first surface 101) between the isolation structures 205 and a dielectric layer 202b covering the transistors 202a, but the invention is not limited thereto.

Figure 1D:
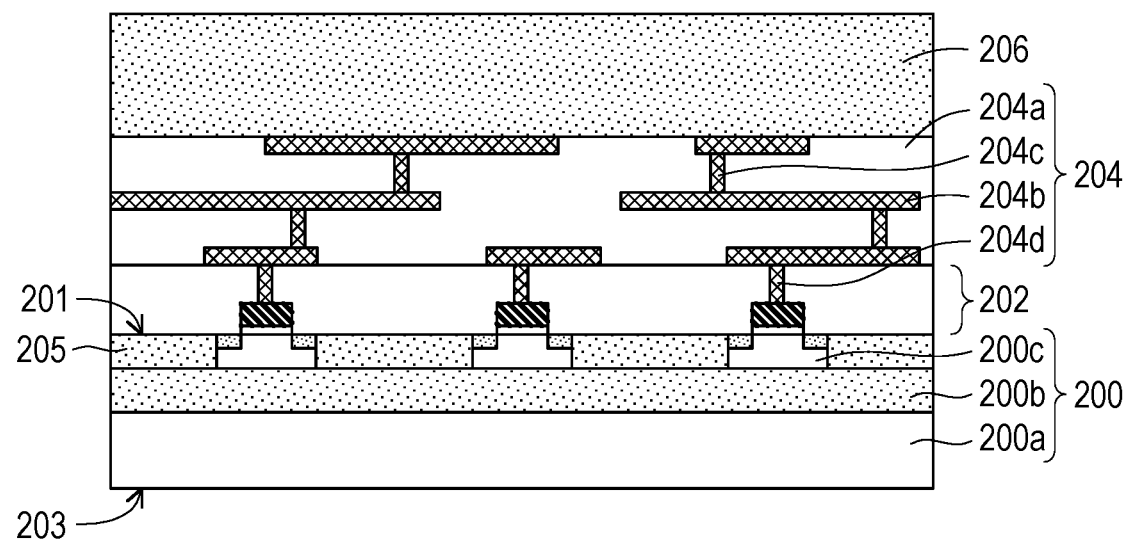

Referring to FIG. 1D, an interconnect structure 204 is formed on the device structure layer 202. In the present embodiment, the interconnect structure 204 includes a dielectric layer 204a, a plurality of circuit layers 204b, a plurality of conductive vias 204c and a plurality of contacts 204d. The dielectric layer 204a is formed on the device structure layer 202. The circuit layers 204b and the conductive vias 204c are formed in the dielectric layer 204a, wherein the conductive vias 204c connect two adjacent circuit layers 204b. The contacts 204d extends into the device structure layer 202 to connect the transistors 202a and the lowermost circuit layer 204b. The detailed configuration and the forming method of the interconnect structure 204 are well-known to those skilled in the art, and will not be further described here.

Then, a second dielectric layer 206 is formed on the interconnect structure 204. In the present embodiment, the second dielectric layer 206 is, for example, a silicon oxide layer. The thickness of the second dielectric layer 206 is, for example, between 1000 Å and 3000 Å. In the present embodiment, the forming method of the second dielectric layer 206 is, for example, a chemical vapor deposition process, but the invention is not limited thereto. After the second dielectric layer 206 is formed, a chemical mechanical polishing process may be performed on the second dielectric layer 206 according to actual needs to further reduce the thickness and the surface roughness of the second dielectric layer 206.

Figure 1E:
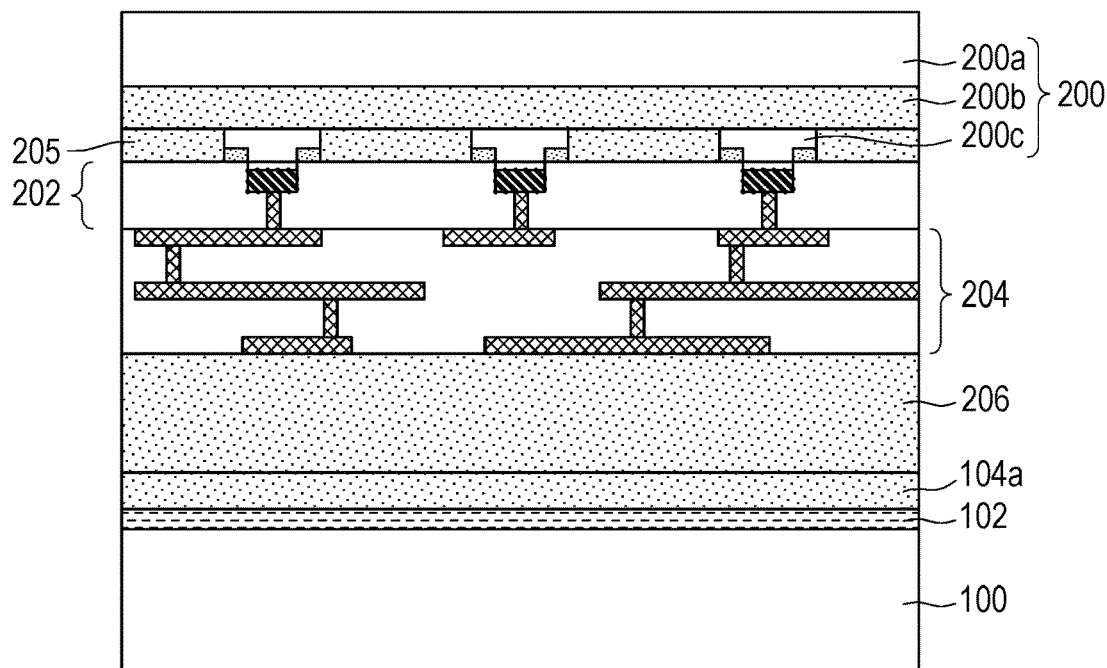

Referring to FIG. 1E, the carrier substrate 100 and the SOI substrate 200 are bonded together in a manner that the first dielectric layer 104a faces the second dielectric layer 206. In the present embodiment, the method for bonding the carrier substrate 100 and the SOI substrate 200 is, for example, a thermocompression bonding process. When the materials of the first dielectric layer 104a and the second dielectric layer 206 are the same, after bonding, there may not be an interface between the first dielectric layer 104a and the second dielectric layer 206. When the materials of the first dielectric layer 104a and the second dielectric layer 206 are different, after bonding, there may be an interface between the first dielectric layer 104a and the second dielectric layer 206. In the present embodiment, the total thickness of the first dielectric layer 104a and the second dielectric layer 206 after bonding is between 2000 Å and 8000 Å, for example.

Figure 1F:
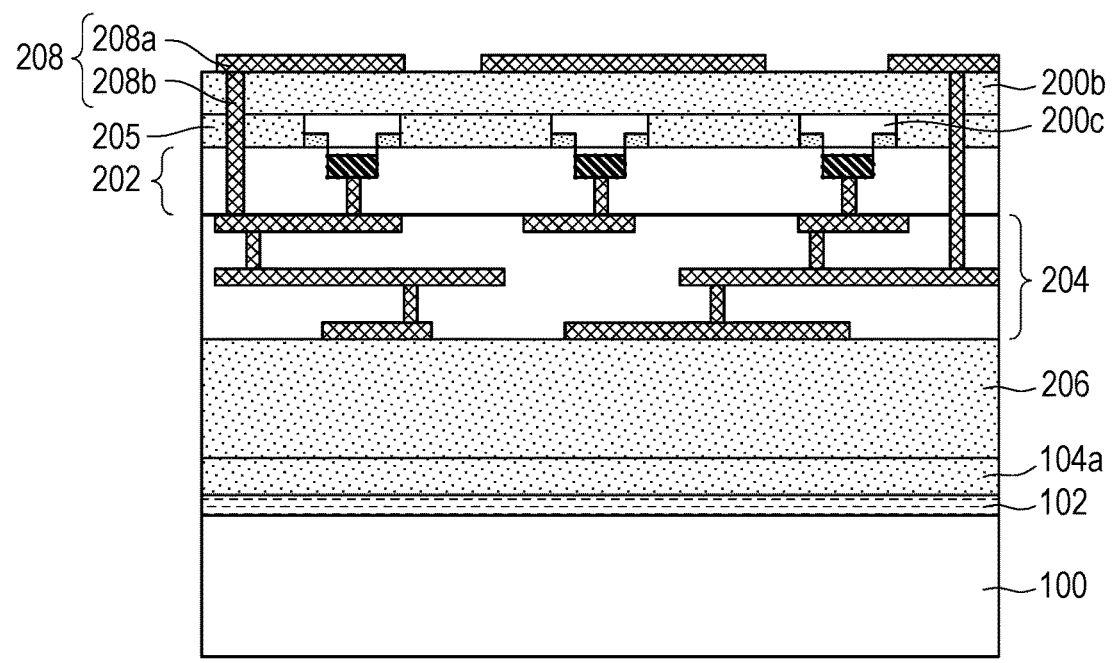

Referring to FIG. 1F, the silicon base 200a of the SOI substrate 200 is removed to expose the insulating layer 200b. In the present embodiment, the method for removing the silicon base 200a of the SOI substrate 200 includes the following steps, for example. The silicon base 200a is thinned, and then an etching process is performed on the thinned silicon base 200a, but the present invention is not limited thereto. In other embodiments, a grinding process may be performed to remove the silicon base 200a. In one embodiment, the method of thinning the silicon base 200a is, for example, a grinding process. In addition, in one embodiment, the etching process is, for example, a TEMA wet etching process.

Next, a circuit structure 208 is formed on the insulating layer 200b. In the present embodiment, the circuit structure 208 includes a circuit layer 208a and conductive vias 208b, but the present invention is not limited thereto. The circuit layer 208a is formed on the insulating layer 200b. In the present embodiment, the conductive vias 208b are connected to the circuit layer 208a and extends from the circuit layer 208a through the insulating layer 200b, the silicon layer 200c and the device structure layer 202 to be connected to the circuit layer 204b of the interconnect structure 204, but the present invention does not Limited thereto. As a result, the circuit structure 208 may be electrically connected to the device structure layer 202. In this way, the semiconductor structure 10 of the present embodiment is formed.

In the semiconductor structure 10 of the present embodiment, the trap-rich layer 102 is disposed between the silicon substrate (carrier substrate 100) and the first dielectric layer 104a. Since the trap-rich layer 102 is disposed between the silicon substrate (carrier substrate 100) and the first dielectric layer 104a, when the semiconductor device 10 is operated, the trap-rich layer 102 may be used to trap negatively charged carriers from the silicon substrate (carrier substrate 100) and reduces the mobility of the negatively charged carriers, to prevent the negatively charged carriers from accumulating with the positively charged carriers in the first dielectric layer 104a to produce a cumulative conductive layer. Thus, the electrical signal loss may be effectively avoided.

It will be apparent to those skilled in the art that various modifications and variations may be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A manufacturing method of a semiconductor structure, comprising:
   forming a trap-rich layer on a carrier substrate;
   forming a first dielectric layer on the trap-rich layer;
   planarizing the first dielectric layer;
   forming a device structure layer on an SOI substrate, wherein the SOI substrate comprises a silicon base and an insulating layer and a silicon layer sequentially stacked on the silicon base;
   forming an interconnect structure on the device structure layer, wherein the interconnect structure is electrically connected to the device structure layer;
   forming a second dielectric layer on the interconnect structure;
   bonding the carrier substrate and the SOI substrate in a manner that the first dielectric layer faces the second dielectric layer;
   removing the silicon base of the SOI substrate; and
   forming a circuit structure on the insulating layer, wherein the circuit structure is electrically connected to the device structure layer.

2. The manufacturing method of a semiconductor structure of claim 1, wherein the trap-rich layer comprises a polysilicon layer, an amorphous silicon layer, a silicon nitride layer, a silicon carbon nitride layer or a combination thereof.

3. The manufacturing method of a semiconductor structure of claim 1, wherein a thickness of the trap-rich layer is between 3000 Å and 20000 Å.

4. The manufacturing method of a semiconductor structure of claim 1, wherein a thickness of the planarized first dielectric layer is between 500 Å and 5000 Å.

5. The manufacturing method of a semiconductor structure of claim 1, wherein the first dielectric layer comprises a silicon oxide layer.

6. The manufacturing method of a semiconductor structure of claim 1, wherein the second dielectric layer comprises a silicon oxide layer.

7. The manufacturing method of a semiconductor structure of claim 1, wherein the carrier substrate comprises a silicon substrate.

8. The manufacturing method of a semiconductor structure of claim 1, wherein the method for planarizing the first dielectric layer comprises performing a chemical mechanical polishing process.

9. The manufacturing method of a semiconductor structure of claim 1, wherein the method for removing the silicon base of the SOI substrate comprises:
   thinning the silicon base; and
   perform an etching process on the thinned silicon base.

\* \* \* \* \*